(12) United States Patent
Iwamoto

(10) Patent No.: US 10,771,027 B2
(45) Date of Patent: Sep. 8, 2020

(54) OPERATIONAL AMPLIFIER CIRCUIT AND CURRENT DETECTION DEVICE USING THE SAME

(71) Applicant: FUJI ELECTRIC CO., LTD., Kawasaki (JP)

(72) Inventor: Motomitsu Iwamoto, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 22 days.

(21) Appl. No.: 16/253,479

(22) Filed: Jan. 22, 2019

(65) Prior Publication Data

US 2019/0296704 A1 Sep. 26, 2019

(30) Foreign Application Priority Data

Mar. 23, 2018 (JP) .................................. 2018-55712

(51) Int. Cl.
| | | |
|---|---|---|
| *H03F 3/04* | (2006.01) | |
| *H03F 3/45* | (2006.01) | |
| *G01R 31/26* | (2020.01) | |
| *H03K 17/082* | (2006.01) | |
| *G05F 1/56* | (2006.01) | |
| *G05F 3/26* | (2006.01) | |
| *G01R 19/00* | (2006.01) | |

(52) U.S. Cl.
CPC ..... *H03F 3/45179* (2013.01); *G01R 19/0092* (2013.01); *G01R 31/2639* (2013.01); *G05F 1/56* (2013.01); *G05F 3/26* (2013.01); *H03K 17/0822* (2013.01); *H03K 2217/0027* (2013.01)

(58) Field of Classification Search
CPC ................. H03F 3/45; G05F 1/56; G05F 3/26
USPC ............................ 330/69, 288, 255; 323/316
See application file for complete search history.

(56) References Cited

U.S. PATENT DOCUMENTS 5,585,701 A * 12/1996 Kaida ................ G01R 19/0092
318/400.27
2010/0097340 A1   4/2010 Mizuhashi et al.

FOREIGN PATENT DOCUMENTS

JP      2007-135274 A    5/2007
JP      2010-97549 A     4/2010

* cited by examiner

*Primary Examiner* — Steven J Mottola

(57) ABSTRACT

An operational amplifier circuit includes a potential control circuit connected between a current sense semiconductor element connected in parallel with a main semiconductor element and a current detection resistor. The potential control circuit controls an output potential of the current sense semiconductor element to be equal to that of the main semiconductor element. The potential control circuit includes a current control element controlling an output current of the current sense semiconductor element and an operational amplifier outputting a signal corresponding to an output potential difference between the current sense semiconductor element and the main semiconductor element to the current control element. An input offset voltage polarity determination unit determines a polarity of an input offset voltage of the operational amplifier according to the output potential difference. The polarity of the input offset voltage is controlled to be constant based on polarity determination of the input offset voltage.

16 Claims, 9 Drawing Sheets

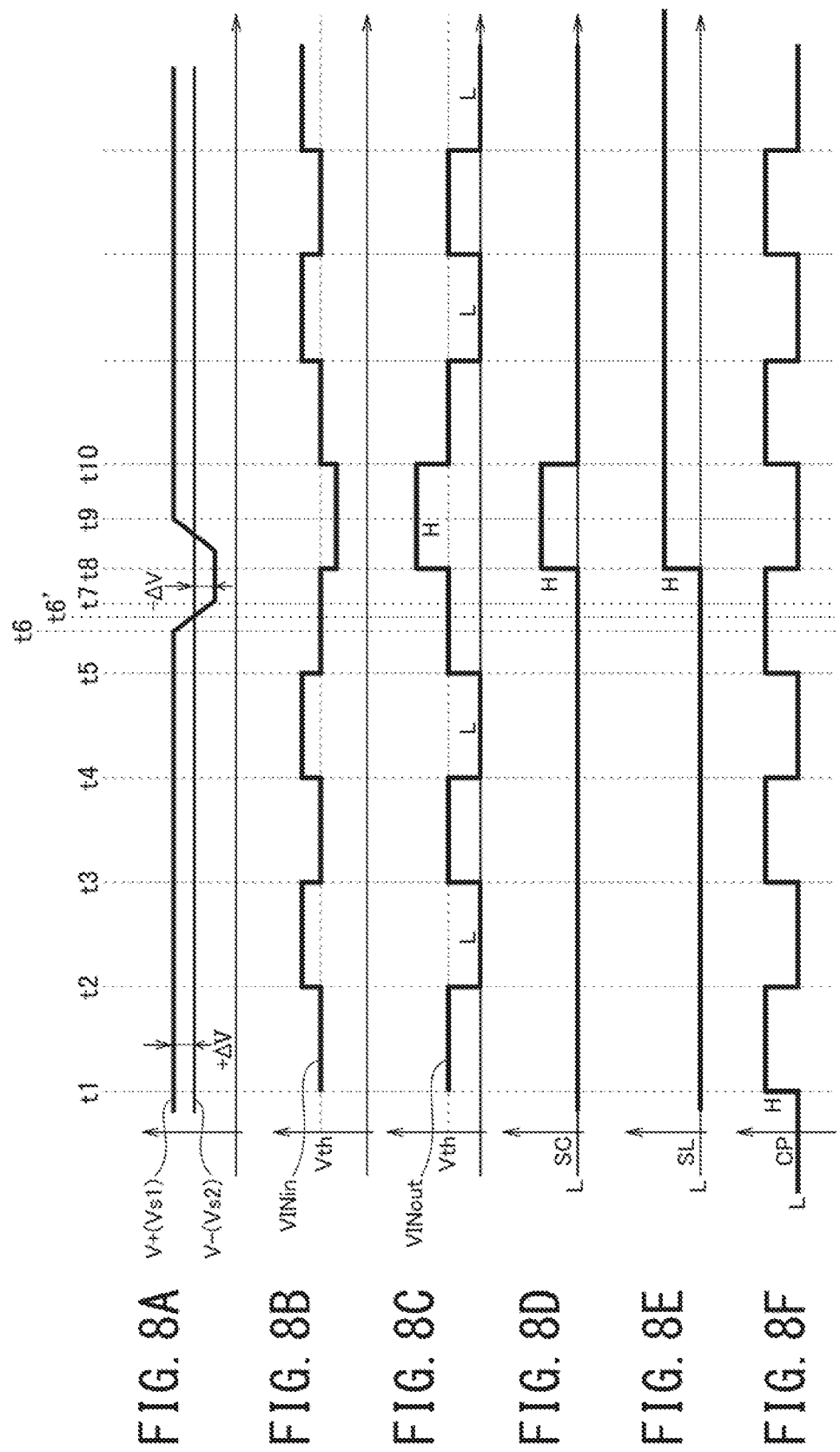

OPERATIONAL AMPLIFIER CIRCUIT AND CURRENT DETECTION DEVICE USING THE SAME

CROSS REFERENCE TO RELATED APPLICATIONS AND INCORPORATION BY REFERENCE

This application claims benefit of priority under 35 USC 119 based on Japanese Patent Application No. 2018-55712 filed on Mar. 23, 2018, the entire contents of which are incorporated by reference herein.

TECHNICAL FIELD

The present invention relates to an operational amplifier circuit including a current sense semiconductor element configured to detect current supplied to a load from a main semiconductor element, and a current detection device using the same.

BACKGROUND ART

As this type of operational amplifier circuit, for example, a semiconductor device has been proposed in which a current sense semiconductor element is connected in parallel with a main semiconductor element configured to supply current to a load, an output potential of the main semiconductor element and an output potential of the current sense semiconductor element are input to an operational amplifier whose differential output controls a current-limiting semiconductor element, thereby controlling the potential of an external current detection resistor (e.g., see JP 2007-135274 A).

SUMMARY OF INVENTION

However, in the conventional technology disclosed in JP 2007-135274 A, when inputting the output potential of the current sense semiconductor element and the output potential of the main semiconductor element to the operational amplifier to control the current-limiting semiconductor element by the differential output of the operational amplifier, there is a problem with an input offset voltage present between a non-inverting input terminal and an inverting input terminal of the operational amplifier. To eliminate influence of the input offset voltage of the operational amplifier, adjustment is made to a reference voltage of a comparator that detects current of the current sense semiconductor element.

The input offset voltage changes due to temperature of the operational amplifier or between before and after package sealing, where the polarity of the voltage may change between positive and negative polarities. The conventional technology disclosed in JP 2007-135274 A cannot prevent such a polarity change, causing a problem where a current detection error becomes large due to the changed input offset voltage.

Accordingly, the present invention has been accomplished in view of the problem of the conventional technology. It is an object of the present invention to provide an operational amplifier circuit capable of, even when the polarity of an input offset voltage of an operational amplifier changes, maintaining constant the polarity of the input offset voltage, and a current detection device using the operational amplifier circuit.

In order to achieve the object mentioned above, according to an aspect of the present invention, there is provided an operational amplifier circuit including a potential control circuit connected between a current sense semiconductor element connected in parallel with a main semiconductor element connected to a power source and configured to supply a drive current to a load and a current detection resistor, the potential control circuit being configured to control an output potential of the current sense semiconductor element to be equal to an output potential of the main semiconductor element. The potential control circuit including a current control element connected between the current sense semiconductor element and the current detection resistor, and an operational amplifier, the output potential of the current sense semiconductor element being input to one of a non-inverting input terminal or an inverting input terminal of the operational amplifier, the output potential of the main semiconductor element being input to another one of the non-inverting input terminal or the inverting input terminal, and the operational amplifier outputting a control signal corresponding to an output potential difference between the current sense semiconductor element and the main semiconductor element to the current control element. The operational amplifier circuit is equipped with an input offset voltage polarity determination unit configured to determine a polarity of an input offset voltage of the operational amplifier according to the potential difference between the current sense semiconductor element and the main semiconductor element. The operational amplifier controls the polarity of the input offset voltage to be constant on a basis of a polarity determination signal of the input offset voltage polarity determination unit.

Additionally, a current detection device according to the present invention is configured to detect the drive current output from the main semiconductor element by using the operational amplifier circuit.

According to the one aspect of the operational amplifier circuit according to the present invention, the polarity of the input offset voltage of the operational amplifier is detected to control so that the polarity of the input offset voltage of the operational amplifier is constant, so that the polarity of the input offset voltage of the operational amplifier can be controlled to be constant even when the polarity of the input offset voltage changes.

In addition, according to the one aspect of the current detection device according to the present invention, the current detection device is formed by using the operational amplifier circuit capable of controlling the polarity of the input offset voltage to be constant, which thus can prevent change of the polarity of the input offset voltage of the operational amplifier, and can highly maintain accuracy for detecting the drive current of the main semiconductor element by the current sense semiconductor element.

BRIEF DESCRIPTION OF DRAWINGS

FIGS. 8A to 8F are time charts for illustrating operation of the first embodiment, in which FIG. 8A indicates an input voltage waveform of the chopper inverter comparator, FIG. 8B indicates an input voltage waveform of an inverter in the chopper inverter comparator, FIG. 8C indicates an output voltage waveform of the inverter in the chopper inverter comparator, FIG. 8D indicates a waveform of a comparison signal output from the chopper inverter comparator, FIG. 8E indicates a waveform of a selection signal output from a toggle flip-flop, and FIG. 8F indicates a waveform of a clock pulse output from a clock pulse generation circuit;

FIGS. 9A and 9B are illustrative diagrams illustrating operation of the conventional technology, in which FIG. 9A is an illustrative diagram of a case where the polarity of an input offset voltage in an initial state is negative, and FIG. 9B is an illustrative diagram of a case where the polarity of the input offset voltage has changed to positive.

DESCRIPTION OF EMBODIMENTS

Next, an embodiment of the present invention will now be described with reference to the drawings. In the following description of the drawings, the same or similar reference signs are assigned to the same or similar constituent components.

In addition, the following embodiments exemplify devices and methods to embody the technical idea of the present invention, and the technical idea of the present invention does not limit the materials, shapes, structures, arrangements, and the like of the constituent components to those described below. The technical idea of the present invention can be subjected to a variety of alterations within the technical scope prescribed by the claims described in CLAIMS.

Hereinafter, a current detection device according to a first embodiment according of the present invention will be described with reference to the accompanying drawings.

Figure 1:
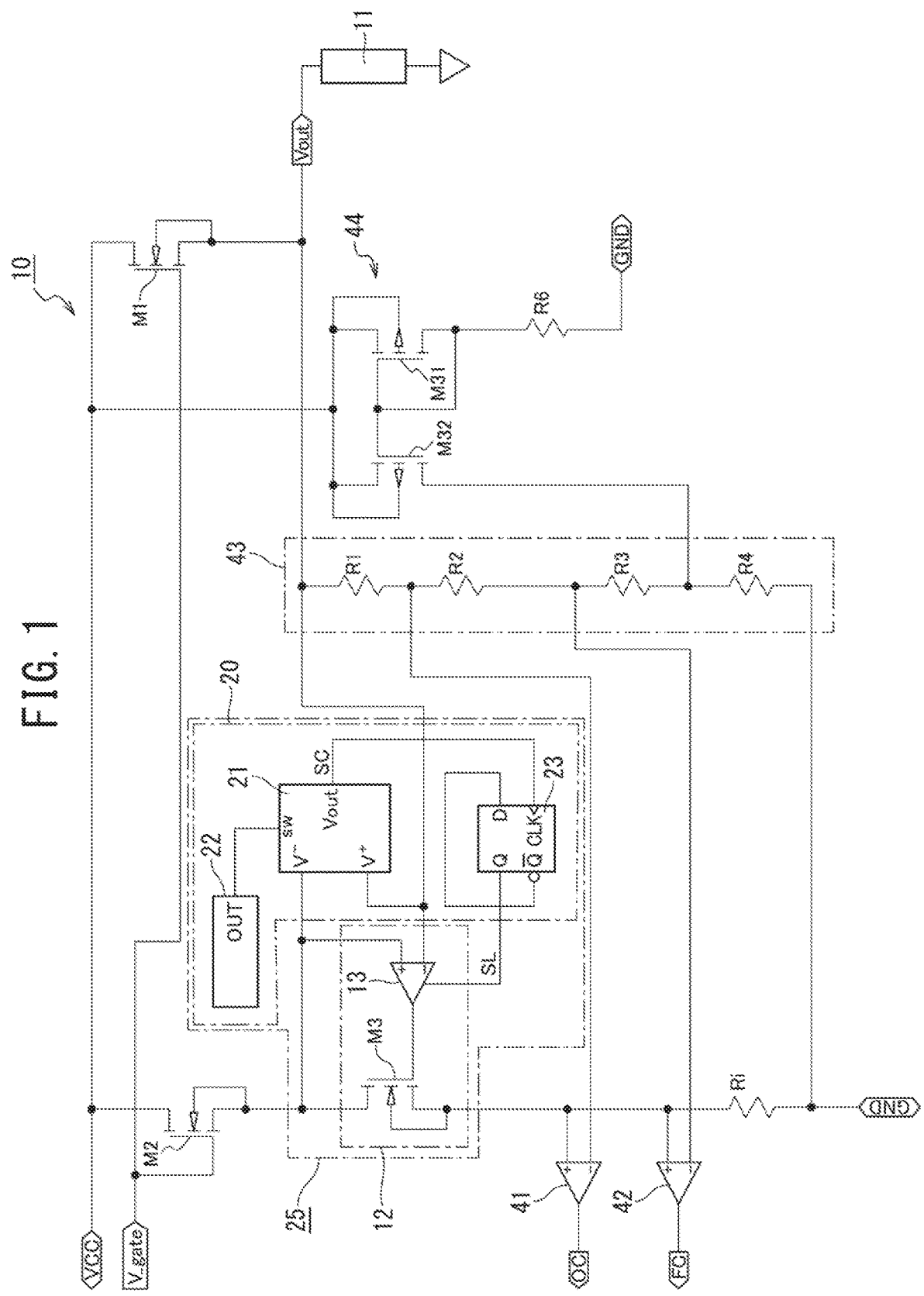
FIG. 1 is a block diagram illustrating one example of a current detection device according to a first embodiment of the present invention.

A current detection device 10 includes a main semiconductor element M1 whose current is to be detected and which is formed of, for example, an N-channel MOSFET, and a current sense semiconductor element M2 configured to detect a drive current output from the main semiconductor element M1, which semiconductor element M2 is formed of, for example, an N-channel MOSFET, as illustrated in FIG. 1.

The main semiconductor element M1 has a drain connected to a power source terminal Vcc, a source connected to a load 11 via an output terminal Vout, and a gate connected to a gate signal input terminal Vgate. In the main semiconductor element M1, the drive current to be supplied to the load 11 is controlled on the basis of a gate signal supplied to the gate thereof.

The current sense semiconductor element M2 has a lower current supply capacity than the main semiconductor element M1, but is formed of a MOSFET whose characteristics are similar to those of the main semiconductor element M1. The current sense semiconductor element M2 has a drain connected to a power source terminal Vcc, a source connected to a ground terminal Gnd via a current detection resistor Ri, and a gate connected to a gate signal input terminal Vgate. The current sense semiconductor element M2 outputs a detection current of 1/K, as compared with the drive current output from the main semiconductor element M1.

A potential control circuit 12 is connected between the current sense semiconductor element M2 and the current detection resistor Ri. The potential control circuit 12 controls the output current of the current sense semiconductor element M2 so that a source potential Vs2 that is an output potential of the current sense semiconductor element M2 becomes equal to a source potential Vs1 that is an output potential of the main semiconductor element M1. The potential control circuit 12 includes an N-channel MOSFET M3 as an example of a current control semiconductor element connected between the current sense semiconductor element M2 and the current detection resistor Ri and an operational amplifier 13.

The MOSFET M3 has a drain connected to the source of the current sense semiconductor element M2, a source connected to the current detection resistor Ri, and a gate connected to an output terminal of the operational amplifier 13.

Figure 2:
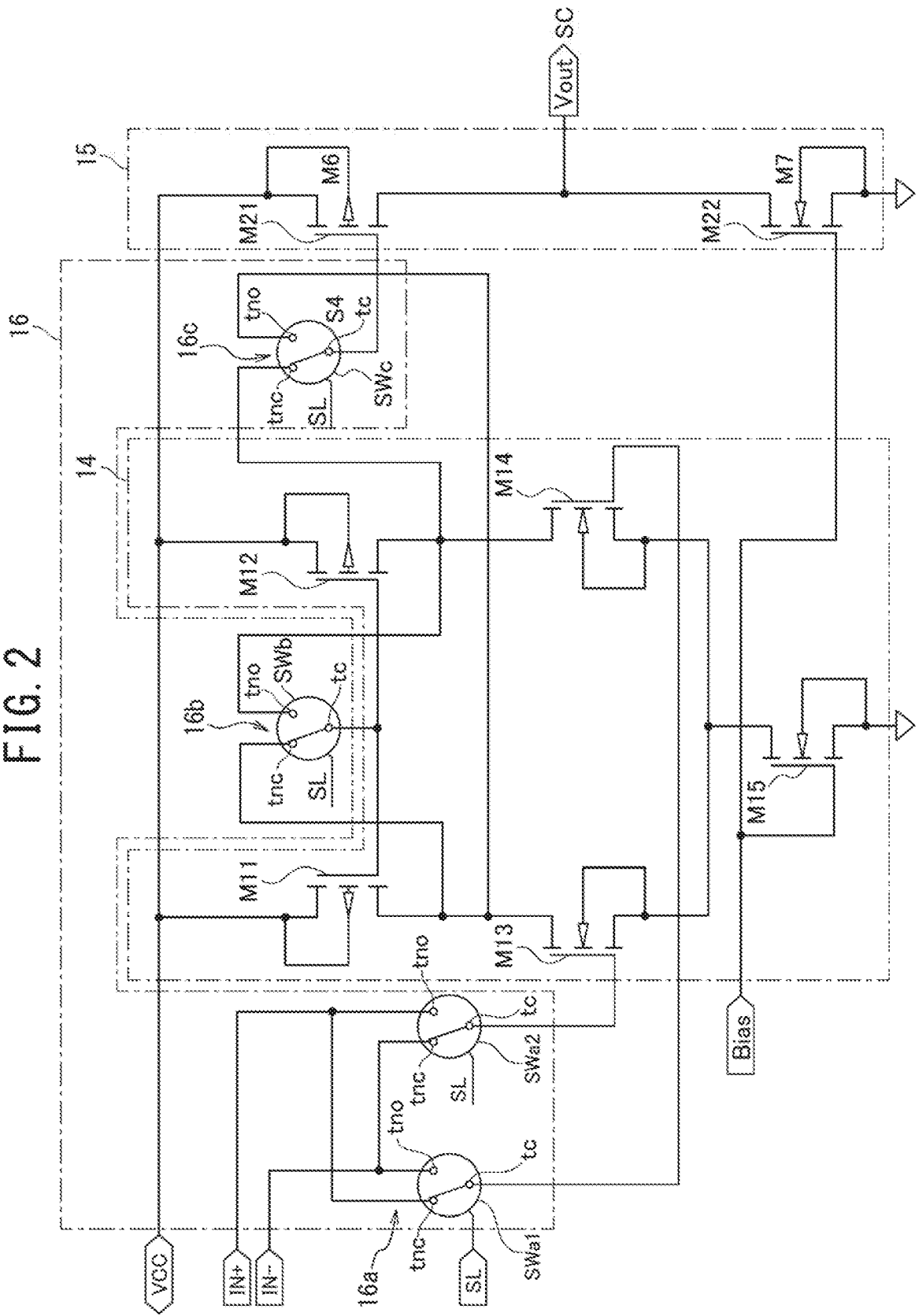
FIG. 2 is a circuit diagram illustrating a specific circuit structure of an offset voltage polarity controlling operational amplifier circuit of FIG. 1.

The operational amplifier 13 is formed of an operational amplifier capable of controlling input offset voltage polarity according to a selection signal SL input. The specific structure of the operational amplifier 13 includes a differential amplifier circuit 14, a push-pull output stage circuit 15, and a selector circuit 16, as illustrated in FIG. 2. The differential amplifier circuit 14 includes a pair of semiconductor elements forming a current mirror circuit 17 connected to the power source terminal Vcc, for example, P-channel MOSFETs M11 and M12, a pair of differential pair elements connected in series to the MOSFETs M11 and M12, for example, N-channel MOSFETs M13 and M14, and an N-channel MOSFET M15 forming a constant current source connected between sources of the MOSFETs M13 and M14 and a ground.

The MOSFETs M11 and M12 have sources connected to each other and connected to the power source terminal Vcc, drains individually connected to drains of the pair of MOSFETs M13 and M14, and gates connected to each other and connected to a second selector section 16b of the selector circuit 16.

The MOSFETs M13 and M14 have gates connected to a first selector section 16a of the selector circuit 16.

The MOSFET M15 has a gate connected to a bias voltage input terminal Bias.

The push-pull output stage circuit 15 includes a P-channel MOSFET M21 and an N-channel MOSFET M22 connected in series between the power source terminal Vcc and a ground. An output terminal Vout is connected between a drain of the MOSFET M21 and a drain of the MOSFET M22. Additionally, the MOSFET M21 has a gate connected to a third selector section 16c of the selector circuit 16. The MOSFET M22 has a source grounded, and the gate of the MOSFET M22 as well as the gate of the MOSFET M15 of the differential amplifier circuit 14 is connected to the bias voltage input terminal Bias.

The selector circuit 16 includes the first selector section 16a, the second selector section 16b, and the third selector section 16c. The first selector section 16a includes two single-pole double-throw analog switches SWa1 and SWa2. The analog switch SWa1 has a common terminal tc connected to the gate of the MOSFET M14 of the differential amplifier circuit 14, a normally closed terminal tnc connected to a non-inverting input terminal IN+, and a normally open terminal tno connected to an inverting input terminal IN−. The analog switch SWa2 has a common terminal tc connected to the gate of the MOSFET M13 of the differential amplifier circuit 14, a normally closed terminal tnc connected to the non-inverting input terminal IN−, and a normally open terminal tno connected to the non-inverting input terminal IN+.

The second selector section 16b is formed of one single-pole double-throw analog switch SWb. The analog switch SWb has a common terminal tc connected to the mutually connected gates of the MOSFETs M11 and M12 of the differential amplifier circuit 14, a normally closed terminal tnc connected to a connection point between the MOSFETs M11 and M13 of the differential amplifier circuit 14, and a normally open terminal tno connected to a connection point between the MOSFETs M12 and M14 of the differential amplifier circuit 14.

The third selector section 16c is formed of one single-pole double throw analog switch SWc. The analog switch SWc has a common terminal tc connected to the gate of the MOSFET M21 of the push-pull output stage circuit 15, a normally closed terminal tnc connected to an output side that is the connection point between the MOSFETs M12 and M14 of the differential amplifier circuit 14, and a normally open terminal tno connected to an output side that is the connection point between the MOSFETs M11 and M13 of the differential amplifier circuit 14.

Then, in each of the analog switches SWa1, SWa2, SWb, and SWc, when the selection signal SL from the input offset voltage polarity determination unit 20, which will be described later, is at low level (hereinafter referred to as L level), the common terminal tc is connected to the normally closed terminal tnc, whereas when the selection signal SL is at high level (hereinafter referred to as H level), the common terminal tc is connected to the normally open terminal tno.

Figure 3:
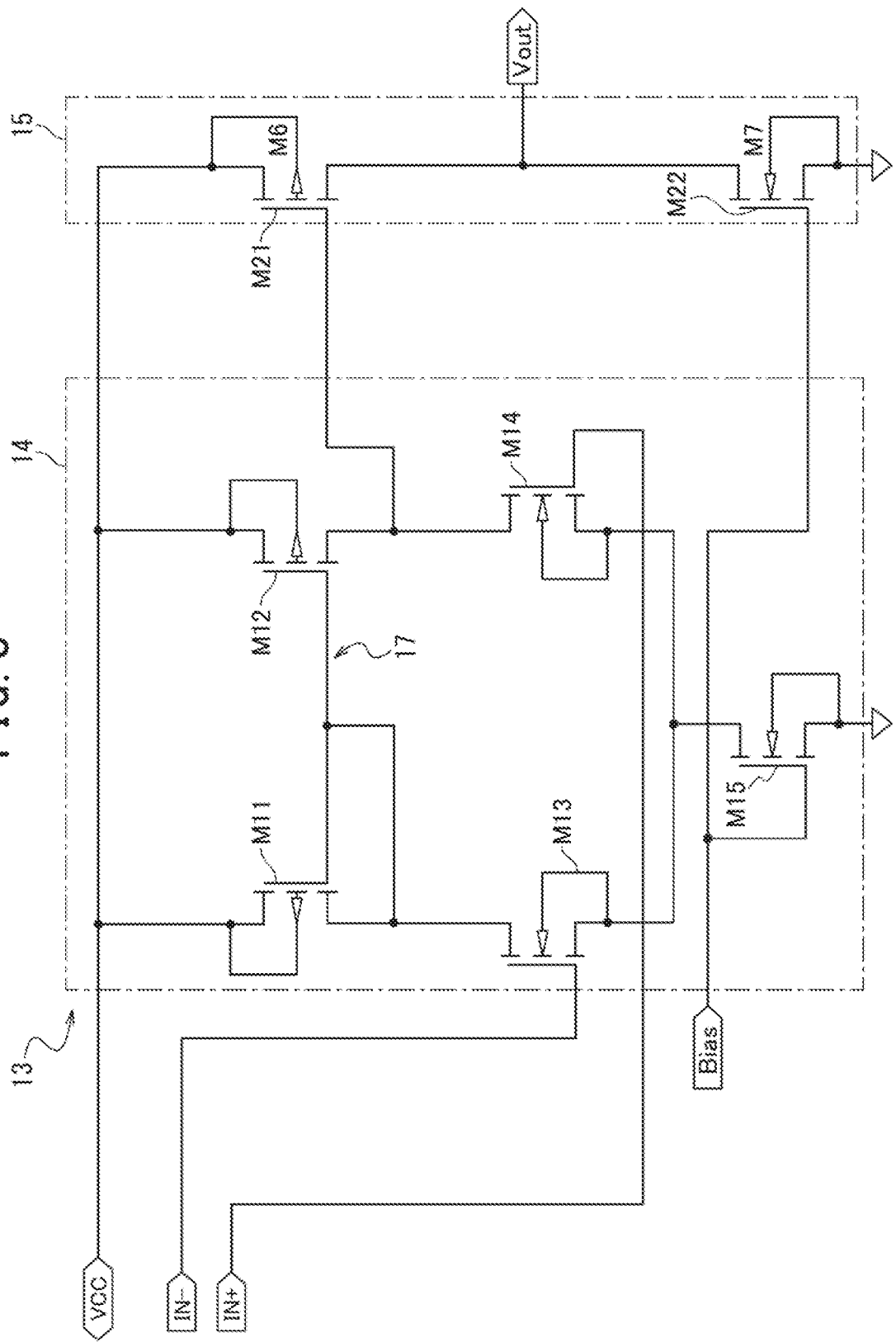
FIG. 3 is a circuit diagram illustrating a connection relation in the offset voltage polarity controlling operational amplifier circuit in the case of a low-level selection signal.

Accordingly, in the operational amplifier 13, when the selection signal SL is at L level, the gate of the MOSFET M13 forming one of the differential pair semiconductor elements is connected to the inverting input terminal IN−, and the gate of the MOSFET M14 forming an other one thereof is connected to the non-inverting input terminal IN+, as illustrated in FIG. 3. Additionally, the mutually connected gates of the MOSFETs M11 and M12 forming the current mirror circuit 17 are connected to the connection point between the MOSFETs M11 and M13. Furthermore, the gate of the MOSFET M21 of the push-pull output stage circuit 15 is connected to the output side that is the connection point between the MOSFETs M12 and M14 of the differential amplifier circuit 14.

Figure 4:
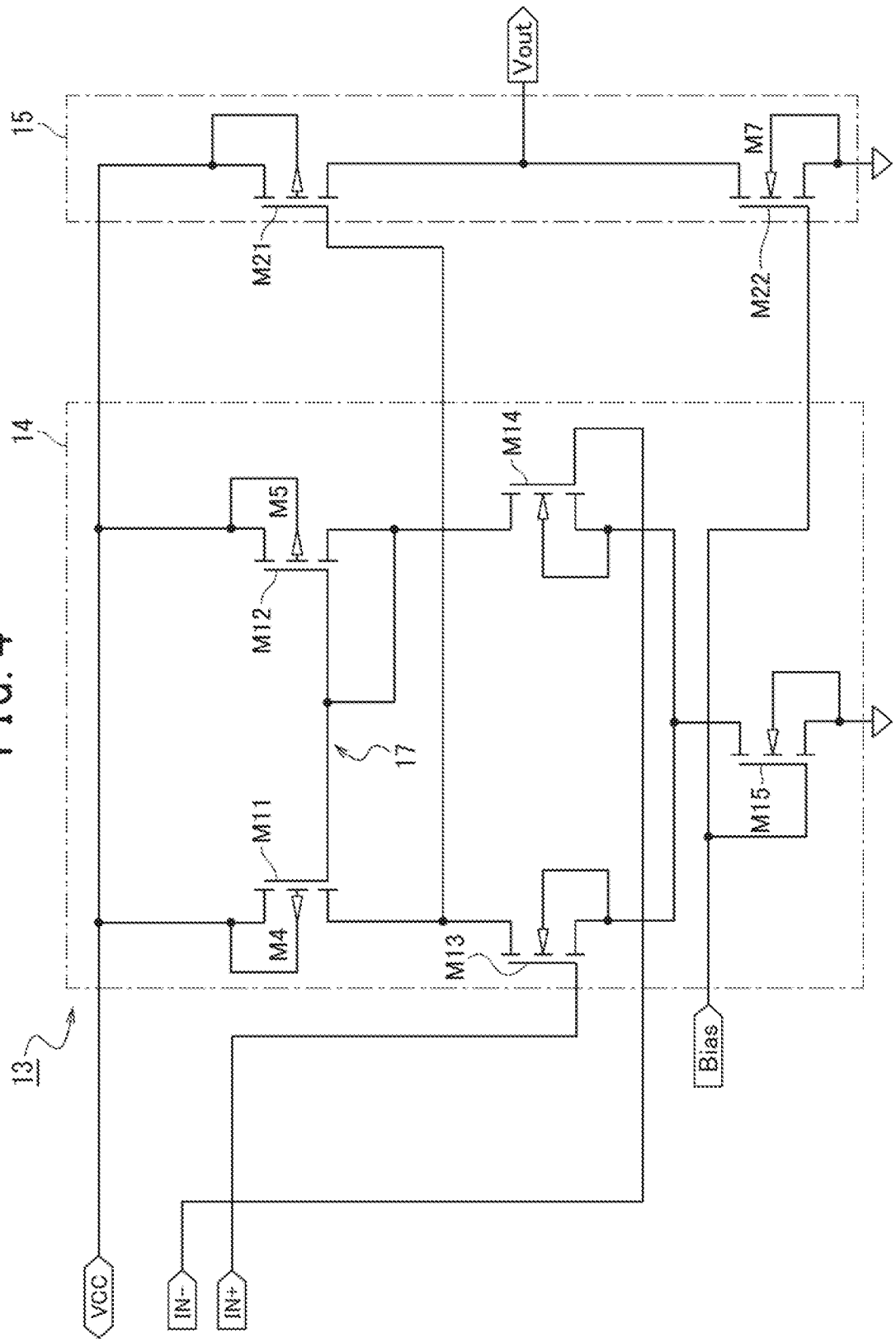
FIG. 4 is a circuit diagram illustrating a connection relation in the offset voltage polarity controlling operational amplifier circuit in the case of a high-level selection signal.

On the other hand, when the selection signal SL is at H level, the gate of the MOSFET M14 forming one of the differential pair semiconductor elements is connected to the inverting input terminal IN−, and the gate of the MOSFET M13 forming the other one thereof is connected to the non-inverting input terminal IN+, as illustrated in FIG. 4. Additionally, the mutually connected gates of the MOSFETs M11 and M12 forming the current mirror circuit 17 are connected to the connection point between the MOSFETs M12 and M14. Furthermore, the gate of the MOSFET M21 of the push-pull output stage circuit 15 is connected to the output terminal that is the connection point between the MOSFETs M11 and M13 of the differential amplifier circuit 14.

In addition, the input offset voltage polarity determination unit 20 configured to generate the selection signal SL for the selector circuit 16 includes a chopper inverter comparator 21, a clock pulse generation circuit 22, and a toggle flip-flop 23, as illustrated in FIG. 1.

Figure 5:
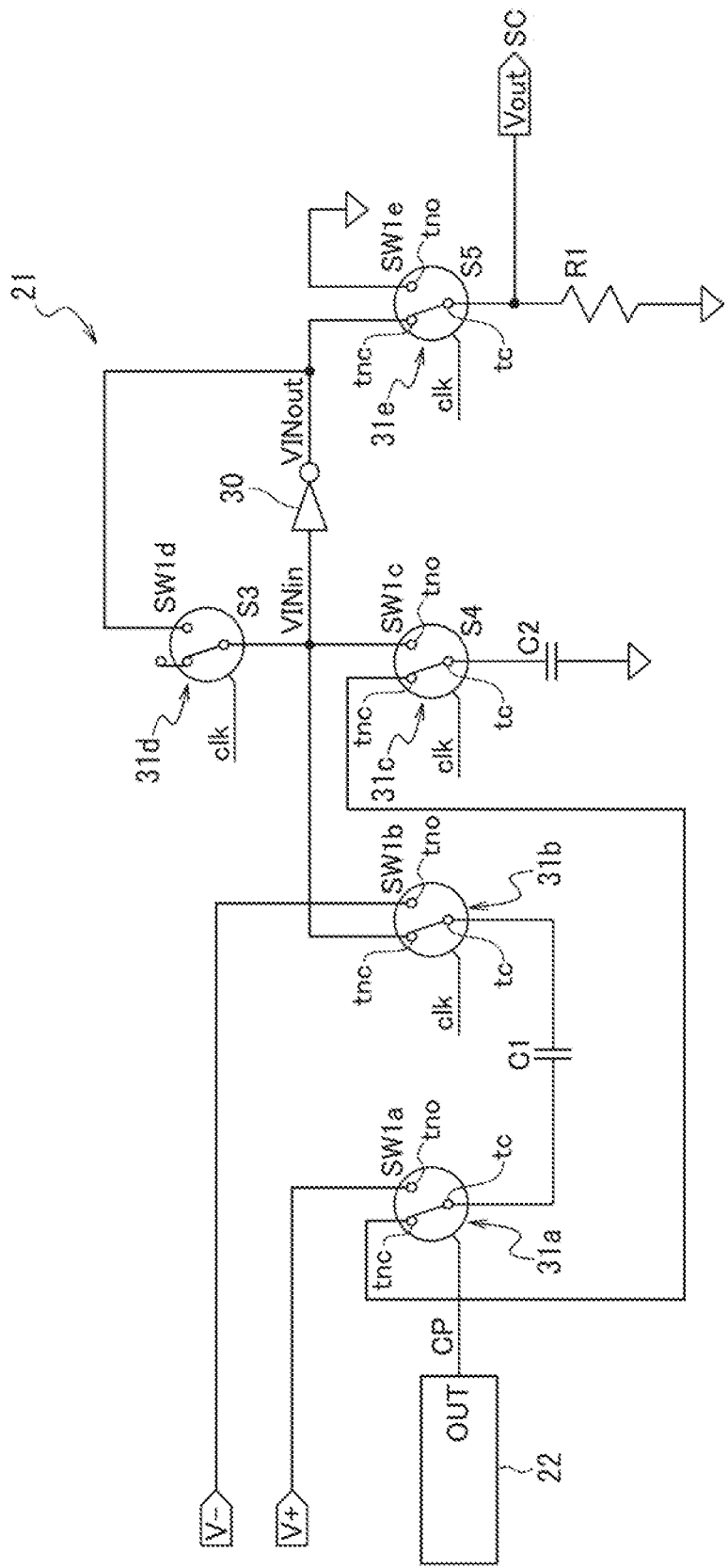
FIG. 5 is a circuit diagram illustrating one example of a chopper inverter comparator of FIG. 1.

The chopper inverter comparator 21 includes an input terminal V− to which the source potential of the current sense semiconductor element M2 input to the non-inverting input terminal of the operational amplifier 13 is input, an input terminal V+ to which the source potential of the main semiconductor element M1 input to the inverting input terminal of the operational amplifier 13 is input, and a signal output terminal Vout configured to output a comparison output signal Sc, as illustrated in FIG. 1. The specific structure of the chopper inverter comparator 21 includes two charge/discharge capacitors C1 and C2, a single inverter 30, a single resistor R1, and five selector sections including first to fifth selector sections 31a to 31e, as illustrated in FIG. 5. The first selector section 31a to the fifth selector section 31e are formed of single-pole double-throw analog switches SW1a to SW1e.

The first and second selector sections 31a and 31b have common terminals tc respectively connected to both ends of the charge/discharge capacitor C1. The first selector section 31a has a normally closed terminal tnc connected to the normally closed terminal tnc of the analog switch SW1c of the third selector section 31c and a normally open terminal tno connected to the input terminal V+.

The analog switch SW1b of the second selector section 31b has a normally closed terminal tnc connected to the input terminal of the inverter 30 and has a normally open terminal tno connected to the input terminal V−.

The analog switch SW1c of the third selector section 31c has a common terminal tc connected to one terminal of the charge/discharge capacitor C2, a normally closed terminal tnc connected to the normally closed terminal tnc of the analog switch SW1a, and a normally open terminal tno connected to a connection point between the normally closed terminal tnc of the analog switch SW1b and the inverter 30.

The analog switch SW1d of the fourth selector section 31d has a common terminal tc connected to a connection point between the normally closed terminal tnc of the analog switch SW1b, the normally open terminal tno of the analog switch SW1c, and the input terminal of the inverter 30, a normally closed terminal tnc arranged as a non-connection terminal, and a normally open terminal tno connected to an output terminal of the inverter 30.

The analog switch SW1e of the fifth selector section 31e has a common terminal tc grounded via a resistor R1, a normally closed terminal tnc connected to a connection point between the output terminal of the inverter 30 and the normally open terminal tno of the analog switch SW1d of the fourth selector section 31d, and a normally open terminal tno grounded.

Additionally, a connection point between the common terminal tc of the analog switch SW1e of the fifth selector section 31e and the resistor R1 is connected to the output terminal Vout.

Herein, in the analog switches SW1a to SW1e, when a rectangular wave-shaped clock pulse CP output from the clock pulse generation circuit 22 is at H level, the common terminal tc is connected to the normally open terminal tno, whereas when the clock pulse CP is at L level, the common terminal tc is connected to the normally closed terminal tnc.

Figure 6:
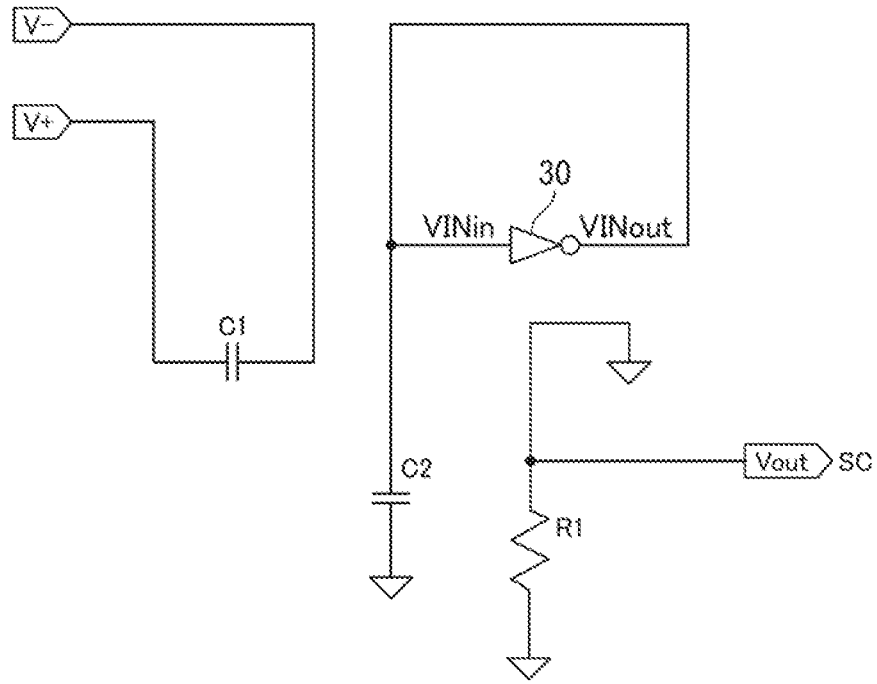
FIG. 6 is a circuit diagram illustrating a connection relation in a state where a high-level clock signal is input to the chopper inverter comparator.

Accordingly, when the clock pulse CP input from the clock pulse generation circuit 22 is at H level, the chopper inverter comparator 21 goes into a charge mode, as illustrated in FIG. 6. In the charge mode, both ends of the charge/discharge capacitor C1 are connected to the input terminals V− and V+ to be charged to a potential difference 0V between the source potential Vs2 of the current sense semiconductor element M2 input to the input terminal V− and the source potential Vs1 of the main semiconductor element M1 input to the input terminal V+. Additionally, the input terminal and the output terminal of the inverter 30 are connected to each other, and a connection point therebetween is connected to one end of the charge/discharge capacitor C2, and the other end of the charge/discharge capacitor C2 is grounded. As a result, the charge/discharge capacitor C2 is charged to a threshold voltage Vth of the inverter 30. Furthermore, both ends of the resistor R1 are grounded, so that the output terminal Vout is at ground potential.

Figure 7:
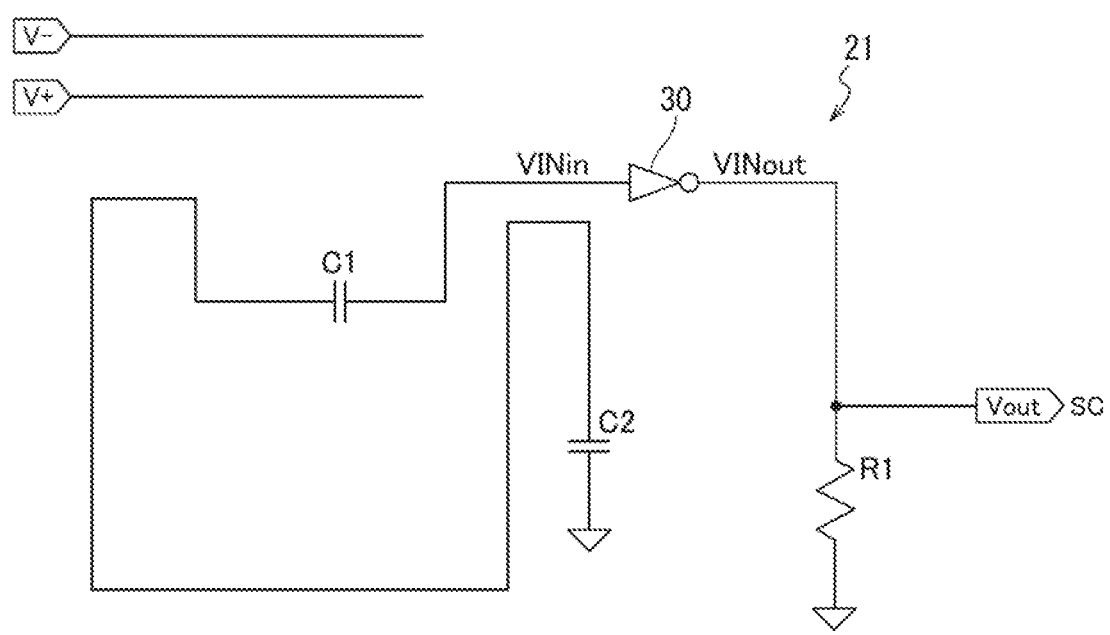
FIG. 7 is a circuit diagram illustrating a connection relation in a state where a low-level clock signal is input to the chopper inverter comparator.

Additionally, when the clock pulse CP input from the clock pulse generation circuit 22 is at L level, the chopper inverter comparator 21 goes into an output mode, as illustrated in FIG. 7. In the output mode, the charge/discharge capacitors C1 and C2 are connected in series, one end of the charge/discharge capacitor C2 is grounded, the other end of the charge/discharge capacitor C2 is connected to one end of the charge/discharge capacitor C1, the other end of the charge/discharge capacitor C1 is connected to the input terminal of the inverter 30, and the output terminal of the inverter 30 is grounded via the resistor R1. Thus, a sum of the potential difference 0V between the source potential Vs2 of the current sense semiconductor element M2 and the source potential Vs1 of the main semiconductor element M1 charged to the charge/discharge capacitor C1 and the threshold voltage Vth of the inverter 30 is input to the input terminal of the inverter 30.

Accordingly, when V+>V−, i.e., when the source potential Vs1 of the main semiconductor element M1 is higher than the source potential Vs2 of the current sense semiconductor element M2, the input voltage of the inverter 30 becomes a higher voltage than the threshold voltage Vth, and the output of the inverter 30 goes to L level.

Conversely, when V+<V−, i.e., when the source potential Vs2 of the current sense semiconductor element M2 is higher than the source potential Vs1 of the main semiconductor element M1, the input voltage of the inverter 30 becomes a lower voltage than the threshold voltage Vth, and the output of the inverter 30 goes to H level.

Accordingly, when the input voltages V+ and V− are in the relationship of V+<V−, the inverter 30 outputs the comparison signal SC at H level to the toggle flip-flop 23 from the output terminal Vout at each predetermined period interval where the clock pulse is in an OFF state.

As illustrated in FIG. 1, in the toggle flip-flop 23, an output signal of a negative output terminal Qb is input to a terminal D, the comparison signal SC of the chopper inverter comparator 21 is input to a clock terminal CLK, and the selection signal SL is input from a positive output terminal Q to a selection signal input terminal is of the operational amplifier 13. In the toggle flip-flop 23, every time the comparison signal SC at H level is input to the clock terminal CLK, the selection signal SL output from the positive output terminal Q is inverted from L level to H level or from H level to L level.

Herein, an operational amplifier circuit 25 is formed including the potential control circuit 12 and the input offset voltage polarity determination unit 20.

In addition, the non-inverting input terminals of a first comparator 41 and a second comparator 42 are connected between the potential control circuit 12 and the current detection resistor Ri. The first comparator 41 detects abnormal overcurrent, and the second comparator 42 detects abnormal current that is lower than abnormal overcurrent but larger than rated current and that can cause abnormality when the current continues to flow.

A reference voltage is supplied to the inverting input terminals of the comparators 41 and 42 from a voltage divider circuit 43 connected between the source of the main semiconductor element M1 and the ground terminal Gnd. The voltage divider circuit 43 includes four resistors R1 to R4 connected in series. A connection point between the resistors R1 and R2 is connected to the inverting input terminal of the first comparator 41, and a connection point between the resistors R2 and R3 is connected to the inverting input terminal of the second comparator 42. Furthermore, constant current output from a constant current output circuit 44 is supplied to a connection point between the resistors R3 and R4 of the voltage divider circuit 43.

The constant current output circuit 44 includes N-channel MOSFETs M31 and M32 whose drains are connected to each other and connected to the power source terminal Vcc, in which the source of the MOSFET M31, which is one of diode-connected MOSFETs, is connected to a ground terminal Gnd via a variable resistor, and the source of the MOSFET M32, which is the other one thereof, is connected between the resistors R3 and R4 of the voltage divider circuit 43.

Next, operation of the first embodiment will be described.

First, when the drive current of the main semiconductor element M1 is defined as Id and a sense ratio of the main semiconductor element M1 and the current sense semiconductor element M2 is defined as K, the output current of the current sense semiconductor element M2 is Id/K.

In this case, when an input offset voltage ΔV of the operational amplifier 13 is "0", an output corresponding to the potential difference between the source potential Vs2 of the current sense semiconductor element M2 input to the non-inverting input terminal V+ of the operational amplifier 13 and the source potential Vs1 of the main semiconductor element M1 input to the inverting input terminal V− thereof is output to the MOSFET M3, thereby controlling so that the source potential Vs2 of the current sense semiconductor element M2 becomes equal to the source potential Vs1 of the main semiconductor element M1. In this case, the output current of the current sense semiconductor element M2 is Id/K.

In this state, when assuming that the selection signal SL output from the toggle flip-flop 23 is at L level, as illustrated in FIG. 8E, the operational amplifier 13 has the connection relation of FIG. 3, in which the inverting input terminal is connected to the gate of the MOSFET M13 of the differential amplifier circuit 14, and the non-inverting input terminal is connected to the gate of the MOSFET M14. Additionally, a differential output output from the connection point between the MOSFETs M12 and M14 of the differential amplifier circuit 14 is output to the gate of the MOSFET M21 of the push-pull output stage circuit 15. As a result, a control output for equalizing the source potential Vs2 of the current sense semiconductor element M2 to the source potential Vs1 of the main semiconductor element M1 is output to the MOSFET M3 from the output terminal Vout.

Next, a description will be given of a case where a negative-polarity input offset voltage $-\Delta V$ occurs in the operational amplifier 13 in an initial state. In this case, the source potential Vs1 of the main semiconductor element M1 input to the inverting input terminal of the operational amplifier 13 is higher than the source potential Vs2 of the current sense semiconductor element M2 input to the non-inverting input terminal of the operational amplifier 13.

Thus, as illustrated in FIG. 8A, at a time point t1, the source potential Vs1 of the main semiconductor element M1 input to the input terminal V+ of the chopper inverter comparator 21 is higher than the source potential Vs2 of the current sense semiconductor element M2 input to the input terminal V− thereof.

In this state, the clock pulse CP is output from the clock pulse generation circuit 22 to the chopper inverter comparator 21. As illustrated in FIG. 8F, the clock pulse CP goes to H level at the time point t1, is inverted to L level at a time point t2, and is again inverted to H level at a time point t3, resulting in a rectangular waveform in which the H and L levels are equal in width. The clock pulse CP is input to the analog switch SW1a of the first selector section 31a to the analog switch SW1e of the fifth selector section 31e in the chopper inverter comparator 21.

Due to this, between the time points t1 and t2 where the clock pulse CP is at H level, the connection relation of the chopper inverter comparator 21 goes into the state illustrated in FIG. 6, whereby the charge/discharge capacitor C1 is charged to the potential difference 0V between the source potential Vs2 of the current sense semiconductor element M2 input to the input terminal V− and the source potential Vs1 of the main semiconductor element M1 input to the input terminal V+. In addition, the charge/discharge capacitor C2 is charged to the threshold voltage Vth of the inverter 30. Accordingly, an input voltage VINin input to the inverter 30 and an output voltage VINout output from the inverter 30 both become the threshold voltage Vth (an intermediate voltage), as illustrated in FIGS. 8B and 8C. In this case, since the output terminal Vout is connected to the ground, the comparison signal SC output from the chopper inverter comparator 21 goes to L level, which is a ground potential, as illustrated in FIG. 8D.

The comparison signal SC at L level is input to the terminal D of the toggle flip-flop 23, whereby the selection signal SL output from the output terminal Q of the toggle flip-flop 23 is maintained at L level, as illustrated in FIG. 8E. Thus, the operational amplifier 13 maintains the internal connection state illustrated in FIG. 3. The input offset voltage remains to be $-\Delta V$, which is in negative polarity.

In this state, when due to influence of temperature change or package sealing, the input offset voltage $-\Delta V$ of the operational amplifier 13 is inverted from negative to positive in polarity, the source potential Vs1 of the main semiconductor element M1 input to the input terminal V+ of the chopper inverter comparator 21 decreases at and after a time point t6 in response to that, and becomes lower than the potential of the input terminal V− at a time point t7, as illustrated in FIG. 8A.

In this case, at a time point t5, the clock pulse CP is inverted from L level to H level, as illustrated in FIG. 8F. Thus, the chopper inverter comparator 21 is in the charge mode for charging to the charge/discharge capacitors C1 and C2 illustrated in FIG. 6. The charge mode continues until a time point t8. Thus, due to V+>V− at the time point t5, the charge/discharge capacitor C1 is charged to a potential difference $+\delta V$, but V+ decreases at and after the time point t6. Then, at a time point t6', V+=V−, so that the charge voltage of the charge/discharge capacitor C1 is "0", and thereafter V+<V−, so that the charge/discharge capacitor C1 is charged to a potential difference $-\delta V$.

Then, at a time point t8, the clock pulse CP changes from H level to L level, as illustrated in FIG. 8F. Due to this, at the time point t8, the connection state of the chopper inverter comparator 21 goes into an output mode where the charge/discharge capacitors C1 and C2 illustrated in FIG. 6 are connected in series and discharge charged electric charges. In response to this, the input voltage VINin supplied to the input terminal of the inverter 30 becomes lower than the threshold voltage Vth of the inverter 30, as illustrated in FIG. 8B. Accordingly, the output voltage VINout output from the output terminal of the inverter 30 goes to a higher H level than the intermediate voltage (the threshold voltage Vth), as illustrated in FIG. 8C. Thus, the comparison signal SC output from the chopper inverter comparator 21 is at H level between the time points t8 and t10, as illustrated in FIG. 8D. The comparison signal SC is output to the terminal D of the toggle flip-flop 23.

As a result, the selection signal SL output from the positive output terminal Q of the toggle flip-flop 23 is inverted from L level to H level, as illustrated in FIG. 8E.

On the other hand, in the operational amplifier 13, the input selection signal SL goes to H level, whereby an input destination for the source potential Vs2 of the current sense semiconductor element M2 supplied to the non-inverting input terminal is changed from the gate of the MOSFET M14 of the differential amplifier circuit 14 to the gate of the MOSFET M13 thereof as illustrated in FIG. 4. Simultaneously with this, an input destination for the source potential Vs1 of the main semiconductor element M1 supplied to the inverting input terminal is changed from the gate of the MOSFET M13 of the differential amplifier circuit 14 to the gate of the MOSFET M14 thereof.

Accordingly, it is equivalent to that when the input offset voltage $\Delta V$ of the operational amplifier 13 changes from negative polarity to positive polarity, the source potential Vs2 of the current sense semiconductor element M2 which has been input to the non-inverting input terminal is input to the inverting input terminal, and the source potential Vs1 of the main semiconductor element M1 which has been input to the inverting input terminal is input to the non-inverting input terminal, so that the input offset voltage of the operational amplifier 13 is maintained at $-\Delta V$ with negative polarity.

As a result, the input voltage V+ of the chopper inverter comparator 30 increases, then exceeds the input voltage V−, and returns to the initial level at a time point t9. Thus, thereafter, the comparison signal SC output from the chopper inverter comparator 21 is maintained at L level, and the selection signal SL output from the toggle flip-flop 23 is also maintained at L level.

Thereafter, when the polarity of the input offset voltage $\Delta V$ of the operational amplifier 13 is inverted, the same operation as above is performed, and the comparison signal SC at H level is input from the chopper inverter comparator 21 to the terminal D of the toggle flip-flop 23, whereby the selection signal SL output from the output terminal Q of the toggle flip-flop 23 is inverted to L level. As a result, the connection relation of the operational amplifier 13 returns to the initial state.

In this manner, according to the first embodiment, the source potential Vs2 of the current sense semiconductor element M2 supplied to the non-inverting input terminal of the operational amplifier 13 and the source potential Vs1 of the main semiconductor element M1 supplied to the inverting input terminal thereof are input to the input offset voltage polarity determination unit 20 to determine the polarity of an input offset voltage generated in the operational amplifier 13. The results of the determination allow the selection signal SL to be inverted from L level to H level when it is determined that the input offset voltage ΔV has changed from negative to positive in polarity. As a result, the source potential Vs2 of the current sense semiconductor element M2 supplied to the non-inverting input terminal of the operational amplifier 13 is input by switching from one of the differential pair semiconductor elements to another one thereof. Simultaneously with this, the source potential Vs1 of the main semiconductor element M1 supplied to the inverting input terminal of the operational amplifier 13 is input by switching from the other one of the differential pair semiconductor elements to the one thereof. By doing this, an apparent polarity of the input offset voltage ΔV of the operational amplifier 13 is maintained at the same polarity.

In this state, when the potential of the current detection resistor Ri becomes higher than a reference potential set in the second comparator 42, the second comparator 42 outputs an H-level current abnormality detection signal. Then, when the potential of the current detection resistor Ri further increases and exceeds a reference voltage set in the first comparator 41, the first comparator 41 outputs an H-level overcurrent detection signal.

Incidentally, the above-described conventional technology does not include the input offset voltage polarity determination unit 20, and compensates for the offset voltages of the operational amplifier 13 and the comparators by changing the reference voltages of the comparators 41 and 42.

Figure 9A:
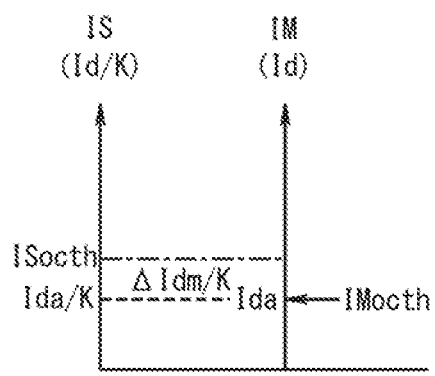

Accordingly, assume a case where the input offset voltage of the operational amplifier 13 has negative polarity in the initial state, as illustrated in FIG. 9A. Herein, a current flowing to the main semiconductor element M1 is defined as IM, and a current flowing to the current sense semiconductor element M2 is defined as IS. The source potential Vs2 of the current sense semiconductor element M2 becomes lower than the source potential Vs1 of the main semiconductor element M1. Due to this, a drain-source voltage of the current sense semiconductor element M2 becomes larger. As a result, the current IS flowing to the current sense semiconductor element M2 flows more than when the input offset voltage is "0".

When an increased amount of current in the current sense semiconductor element M2 in this case is defined as ΔIdm/K, the current IS flowing to the current sense semiconductor element M2 corresponding to an overcurrent Ida of the current IM flowing to the main semiconductor element M1 is Ida/K+ΔIdm/K. In other words, to accurately detect the overcurrent Ida flowing to the main semiconductor element M1 in the case where the operational amplifier 13 has a negative input offset voltage, it is necessary to set a current threshold ISocth of the current sense semiconductor element M2 to Ida/K+ΔIdm/K, as illustrated in FIG. 9A.

Figure 9B:
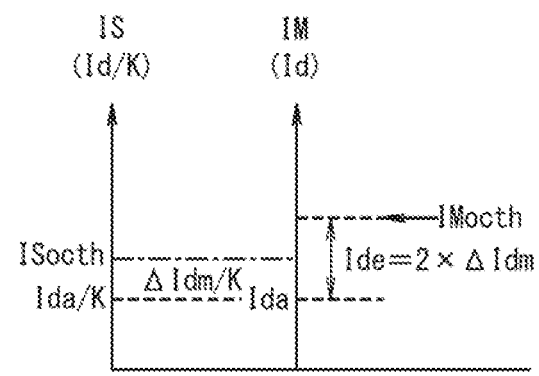

On the other hand, when, with the current threshold ISocth of the current sense semiconductor element M2 set in this state, the input offset voltage of the operational amplifier 13 is inverted from negative polarity to positive polarity due to temperature change or package sealing, the drain-source voltage is larger in the main semiconductor element M2 than in the current sense semiconductor element M2. Thus, as illustrated in FIG. 9B, when the current IS of the current sense semiconductor element M2 is Ida/K+ΔIdm/K, the current IM flowing to the main semiconductor element M1 is Ida+2×ΔIdm, whereby an overcurrent threshold value IMocth of the main semiconductor element M1 side increases by a current detection error Ide of 2×ΔIdm.

As described above, in the conventional technology, while there is no problem when the polarity of the input offset voltage of the operational amplifier does not change, a problem occurs where current detection accuracy in detecting overcurrent is reduced when the polarity of the input offset voltage of the operational amplifier changes due to temperature change, package sealing, or the like.

By contrast, in the present invention, when the input offset voltage ΔV of the operational amplifier 13 changes from negative polarity to positive polarity or returns to negative polarity from positive polarity, the polarity of the input offset voltage can be maintained as described above, thus enabling improvement in current detection accuracy.

Figure 10:
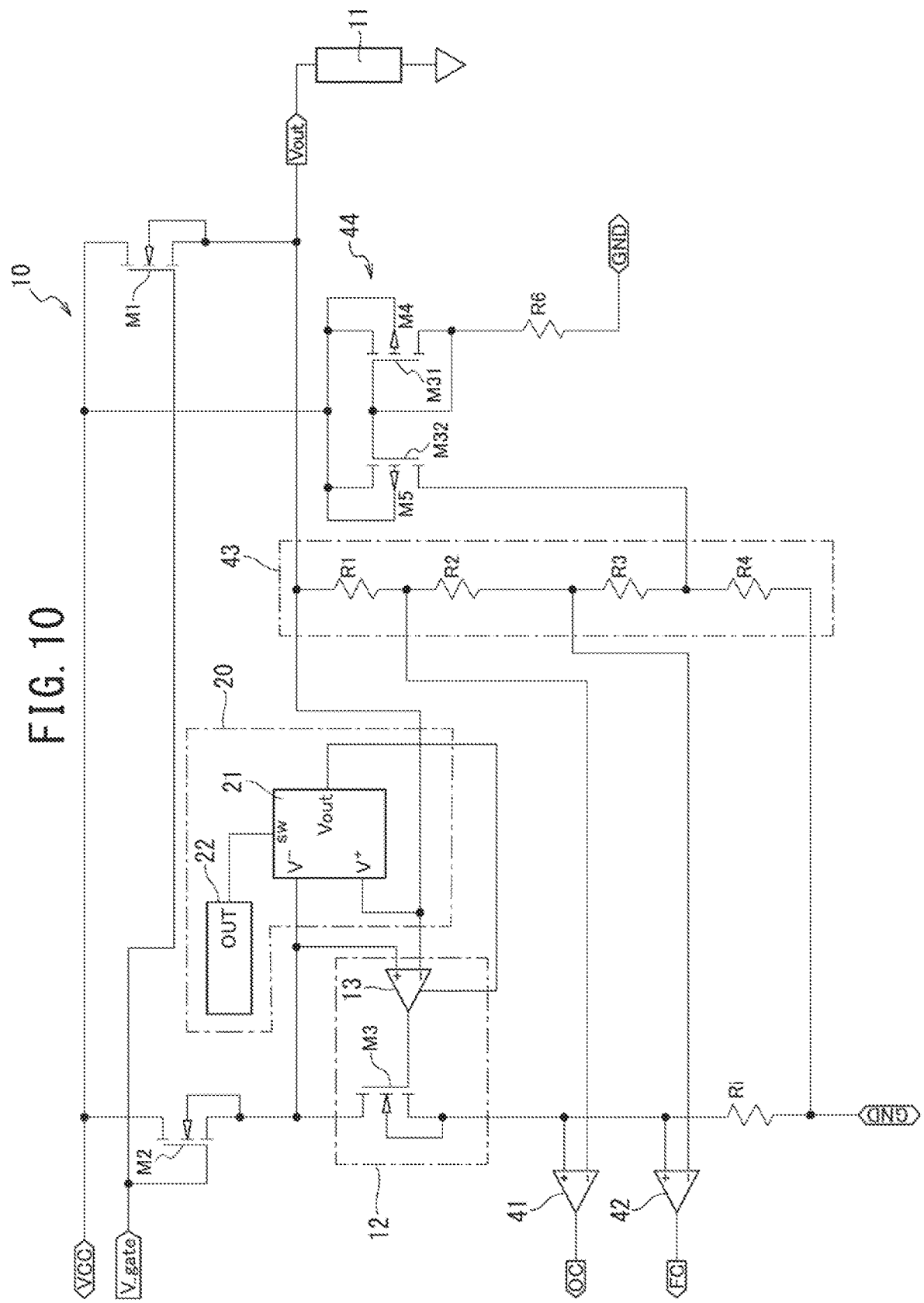
FIG. 10 is a block diagram illustrating a modification of the current detection device according to the present invention.

Note that the above embodiment has been described the case where the input offset voltage polarity determination unit 20 includes the chopper inverter comparator 21, the clock pulse generation circuit 22, and the toggle flip-flop 23, the invention is not limited thereto. As illustrated in FIG. 10, the toggle flip-flop 23 may be omitted, and the comparison signal SC of the chopper inverter comparator 21 may be directly input as the selection signal SL to the selection signal input terminal is of the operational amplifier 13.

In this case, the comparison signal SC goes to H level only for a predetermined period of time corresponding to a half cycle of the clock pulse CP when the input offset voltage ΔV of the operational amplifier 13 changes from negative polarity to positive polarity, as illustrated in FIG. 8D. Thus, at a time point when the selection signal SL returns to L level, the input offset voltage ΔV of the operational amplifier 13 returns to positive polarity. However, in the next cycle, again, the selection signal SL goes to H level, and the input offset voltage ΔV of the operational amplifier 13 changes to negative polarity. Accordingly, in the polarity of the input offset voltage ΔV of the operational amplifier 13, negative polarity and positive polarity are alternatively repeated. Even in this case, reduction of the current detection accuracy can be suppressed as compared with the case where the input offset voltage ΔV of the operational amplifier 13 remains changed from negative polarity to positive polarity.

In addition, while the above embodiment has been described the case where the input offset voltage ΔV of the operational amplifier 13 changes from negative polarity to positive polarity, the invention is not limited thereto. The present invention can be applied also to cases where the input offset voltage ΔV of the operational amplifier 13 changes from positive polarity to negative polarity.

Furthermore, the above embodiment has been described the case where the source potential Vs2 of the current sense semiconductor element M2 is input to the non-inverting input terminal of the operational amplifier 13, and the source potential Vs1 of the main semiconductor element M1 is input to the inverting input terminal thereof. However, the invention is not limited thereto. The source potential Vs2 of the current sense semiconductor element M2 may be input to the inverting input terminal of the operational amplifier 13, and the source potential Vs2 of the main semiconductor element M1 may be input to the non-inverting input terminal thereof. The same may also apply to input to the input terminals V+ and V− of the chopper inverter comparator 21.

Still furthermore, while the above embodiment has been described the case where the operational amplifier circuit according to the present invention has been applied to the current detection device, the invention is not limited thereto. The operational amplifier circuit according to the invention may be applicable to cases where control is performed to equalize potentials input to the non-inverting input terminal and the inverting input terminal of an operational amplifier circuit.

REFERENCE SIGNS LIST

10: Current detection device
11: Load
M1: Main semiconductor element
M2: Current sense semiconductor element
12: Potential control circuit
M3: MOSFET
13: Operational amplifier
14: Differential amplifier circuit
15: Push-pull output stage circuit
16: Selector circuit
17: Current mirror circuit
M11 to M15: MOSFET
16a: First selector section
16b: Second selector section
16c: Third selector section
SWa1, SWa2, SWb, SWc: Analog switch
20: Input offset voltage polarity determination unit
21: Chopper inverter comparator
22: Clock pulse generation circuit
23: Toggle flip-flop
25: Operational amplifier circuit
C1, C2: Charge/discharge capacitor
30: Inverter
31a: First selector section
31b: Second selector section
31c: Third selector section
31d: Fourth selector section
31e: Fifth selector section
SW1a to Sw1e: Analog switch
41: First comparator
42: Second comparator
43: Voltage divider circuit
44: Constant current output circuit

The invention claimed is:

1. An operational amplifier circuit comprising:
a potential control circuit connected between a current detection resistor and a current sense semiconductor element connected in parallel with a main semiconductor element which is connected to a power source and configured to supply a drive current to a load, the potential control circuit being configured to control an output potential of the current sense semiconductor element to be equal to an output potential of the main semiconductor element, the potential control circuit including
a current control element connected between the current sense semiconductor element and the current detection resistor, and
an operational amplifier, the output potential of the current sense semiconductor element being input to one of a non-inverting input terminal or an inverting input terminal of the operational amplifier, the output potential of the main semiconductor element being input to another one of the non-inverting input terminal or the inverting input terminal, and the operational amplifier configured to output a control signal corresponding to a potential difference between the current sense semiconductor element and the main semiconductor element to the current control element; and an input offset voltage polarity determination circuit configured to determine a polarity of an input offset voltage of the operational amplifier according to the potential difference between the current sense semiconductor element and the main semiconductor element,
wherein
the operational amplifier controls the polarity of the input offset voltage to be constant on a basis of a polarity determination signal of the input offset voltage polarity determination circuit.

2. The operational amplifier circuit according to claim 1, wherein the input offset voltage polarity determination circuit includes a chopper inverter comparator in which the output potential of the current sense semiconductor element and the output potential of the main semiconductor element are input.

3. The operational amplifier circuit according to claim 1, wherein the operational amplifier includes:
a differential amplifier circuit in which a pair of semiconductor elements forming a current mirror circuit and a pair of differential pair elements forming a differential pair are connected in series to each other;
a push-pull output stage circuit in which a differential output of the differential amplifier circuit is input;
a first selector section configured to select one of the non-inverting input terminal or the inverting input terminal to be connected to a control terminal of one of the pair of differential pair elements and select another one of the non-inverting input terminal or the inverting input terminal to be connected to a control terminal of another one of the pair of differential pair elements;
a second selector section configured to select one of the pair of semiconductor elements of the current mirror circuit to be diode-connected; and
a third selector section configured to select an output side of the differential amplifier circuit to be connected to the push-pull output stage circuit, wherein
the input offset voltage polarity determination circuit is configured to supply the polarity determination signal as a selection signal to the first selector section, the second selector section, and the third selector section.

4. The operational amplifier circuit according to claim 1, wherein a toggle flip-flop is connected between the input offset voltage determination circuit and the operational amplifier.

5. A current detection device comprising the operational amplifier circuit according to claim 1.

6. The operational amplifier circuit according to claim 2, wherein the operational amplifier includes:
a differential amplifier circuit in which a pair of semiconductor elements forming a current mirror circuit and a pair of differential pair elements forming a differential pair are connected in series to each other;
a push-pull output stage circuit in which a differential output of the differential amplifier circuit is input;
a first selector section configured to select one of the non-inverting input terminal or the inverting input terminal to be connected to a control terminal of one of the pair of differential pair elements and select another one of the non-inverting input terminal or the inverting input terminal to be connected to a control terminal of another one of the pair of differential pair elements;
a second selector section configured to select one of the pair of semiconductor elements of the current mirror circuit to be diode-connected; and a third selector section configured to select an output side of the differential amplifier circuit to be connected to the push-pull output stage circuit, wherein
the input offset voltage polarity determination circuit is configured to supply the polarity determination signal as a selection signal to the first selector section, the second selector section, and the third selector section.

7. The operational amplifier circuit according to claim 2, wherein a toggle flip-flop is connected between the input offset voltage determination circuit and the operational amplifier.

8. The operational amplifier circuit according to claim 3, wherein a toggle flip-flop is connected between the input offset voltage determination circuit and the operational amplifier.

9. The operational amplifier circuit according to claim 6, wherein a toggle flip-flop is connected between the input offset voltage determination circuit and the operational amplifier.

10. A current detection device comprising the operational amplifier circuit according to claim 2.

11. A current detection device comprising the operational amplifier circuit according to claim 3.

12. A current detection device comprising the operational amplifier circuit according to claim 4.

13. A current detection device comprising the operational amplifier circuit according to claim 6.

14. A current detection device comprising the operational amplifier circuit according to claim 7.

15. A current detection device comprising the operational amplifier circuit according to claim 8.

16. A current detection device comprising the operational amplifier circuit according to claim 9.

* * * * *